(12) United States Patent
Karlicek et al.

(10) Patent No.: US 9,245,875 B2
(45) Date of Patent: Jan. 26, 2016

(54) LIGHT EMITTING DIODES AND A METHOD OF PACKAGING THE SAME

(71) Applicant: Rensselaer Polytechnic Institute, Troy, NY (US)

(72) Inventors: Robert F. Karlicek, Mechanicville, NY (US); James Jian-Qiang Lu, Watervliet, NY (US); Charles Sanford Goodwin, Latham, NY (US); Anton Tkachenko, Troy, NY (US)

(73) Assignee: RENSSELAER POLYTECHNIC INSTITUTE, Troy, NY (US)

( * ) Notice: Subject to any disclaimer, the term of this patent is extended or adjusted under 35 U.S.C. 154(b) by 0 days.

(21) Appl. No.: 14/394,501

(22) PCT Filed: Apr. 19, 2013

(86) PCT No.: PCT/US2013/037288
§ 371 (c)(1),
(2) Date: Oct. 15, 2014

(87) PCT Pub. No.: WO2013/158949
PCT Pub. Date: Oct. 24, 2013

(65) Prior Publication Data
US 2015/0050761 A1 Feb. 19, 2015

Related U.S. Application Data

(60) Provisional application No. 61/687,240, filed on Apr. 20, 2012.

(51) Int. Cl.
*H01L 25/075* (2006.01)
*H01L 23/00* (2006.01)
*H01L 21/683* (2006.01)

(52) U.S. Cl.
CPC ........ *H01L 25/0753* (2013.01); *H01L 21/6836* (2013.01); *H01L 24/05* (2013.01);
(Continued)

(58) Field of Classification Search
CPC H01L 2924/00; B81C 1/00007; B81C 3/002; Y10T 29/53196
See application file for complete search history.

(56) References Cited

U.S. PATENT DOCUMENTS

| 2005/0249945 A1 | 11/2005 | Yang |
| 2006/0051517 A1* | 3/2006 | Haas et al. ............... 427/457 |

(Continued)

FOREIGN PATENT DOCUMENTS

| EP | 1073095 | 1/2001 |
| JP | 2001-237266 A | 8/2001 |

(Continued)

OTHER PUBLICATIONS

International Search Report for PCT/US2013/037288 mailed Jul. 29, 2013.

(Continued)

*Primary Examiner* — Marvin Payen
*Assistant Examiner* — Victor Barzykin
(74) *Attorney, Agent, or Firm* — RatnerPrestia

(57) ABSTRACT

Disclosed herein is a method of assembling an array of light emitting diode (LED) dies on a substrate comprising: positioning dies in fluid; exposing the dies to a magnetic force to attract the dies onto magnets that are arranged at pre-determined locations either on or near the substrate; and forming permanent connections between the dies and the substrate thereby constituting an array of LED dies on a substrate.

6 Claims, 3 Drawing Sheets

(52) U.S. Cl.
CPC ............... *H01L 24/75* (2013.01); *H01L 24/76* (2013.01); *H01L 24/95* (2013.01); *H01L 24/24* (2013.01); *H01L 24/29* (2013.01); *H01L 24/32* (2013.01); *H01L 24/82* (2013.01); *H01L 24/83* (2013.01); *H01L 2221/68327* (2013.01); *H01L 2221/68381* (2013.01); *H01L 2221/68386* (2013.01); *H01L 2224/04026* (2013.01); *H01L 2224/05655* (2013.01); *H01L 2224/245* (2013.01); *H01L 2224/24225* (2013.01); *H01L 2224/291* (2013.01); *H01L 2224/32225* (2013.01); *H01L 2224/75252* (2013.01); *H01L 2224/75283* (2013.01); *H01L 2224/75655* (2013.01); *H01L 2224/75701* (2013.01); *H01L 2224/75733* (2013.01); *H01L 2224/75801* (2013.01); *H01L 2224/76655* (2013.01); *H01L 2224/76701* (2013.01); *H01L 2224/76733* (2013.01); *H01L 2224/76801* (2013.01); *H01L 2224/82002* (2013.01); *H01L 2224/82102* (2013.01); *H01L 2224/82143* (2013.01); *H01L 2224/83002* (2013.01); *H01L 2224/8323* (2013.01); *H01L 2224/83143* (2013.01); *H01L 2224/83191* (2013.01); *H01L 2224/83801* (2013.01); *H01L 2224/9202* (2013.01); *H01L 2224/95101* (2013.01); *H01L 2224/95144* (2013.01); *H01L 2924/10253* (2013.01); *H01L 2924/12041* (2013.01); *H01L 2933/0066* (2013.01)

(56) References Cited

U.S. PATENT DOCUMENTS

| | | | |
|---|---|---|---|
| 2007/0087472 A1* | 4/2007 | Huber et al. | ............ 438/106 |
| 2008/0023435 A1 | 1/2008 | Wu et al. | |
| 2008/0121724 A1 | 5/2008 | Beer et al. | |
| 2012/0039690 A1 | 2/2012 | Stangl | |

FOREIGN PATENT DOCUMENTS

| | | |
|---|---|---|
| JP | 2004119502 | 4/2004 |
| KR | 2020000013544 | 7/2000 |

OTHER PUBLICATIONS

Written Opinion of the International Searching Authority for International Application No. PCT/US2013/037288, mailed Jul. 29, 2013.
Ramadan et al., "Large scale microcomponents assebly using an external magnetic array," Applied Physics Letters 90, 172502 (2007).
Supplementary European Search Report issued in EP 13 77 8001 dated Nov. 27, 2015.

* cited by examiner

LIGHT EMITTING DIODES AND A METHOD OF PACKAGING THE SAME

CROSS REFERENCE TO RELATED APPLICATIONS

This application is the U.S. National Phase Application of PCT/US2013/037288, filed Apr. 19, 2013 and claims the benefit of U.S. Provisional Application No. 61/687,239 entitled SENSORY LIGHTING SYSTEM filed on Apr. 20, 2012, the contents of which are incorporated herein by reference.

STATEMENT REGARDING FEDERALLY SPONSORED RESEARCH

The present invention was supported in part by a grant from the National Science Foundation (Grant No. EEC-0812056) and in part by a grant from NYSTAR (Grant No. C090145). The United States Government may have certain rights to the invention.

FIELD OF THE INVENTION

The present invention relates to light emitting diodes (LED's) based on inorganic semiconductor materials and a method for packaging LED's.

BACKGROUND OF THE INVENTION

Current LED packaging typically involves a process where semiconductor devices are positioned on a substrate one at a time. Typical processes may be limited to a speed of about 10K units per hour. There exists a need to package these devices, as well as associated control and sensing devices, into integrated lighting systems at much higher speeds, e.g., up to 10K units per minute. Some current approaches, including die printing and mesoscopic self assembly processes, can be limited by the availability of manufacturable LED chip designs and defect rates associated with high speed placement errors.

SUMMARY OF THE INVENTION

Described herein are programmable directed self assembly and energy assisted placement processes suitable for high speed, high accuracy, and low defect rate light emitting diode (LED) system packaging operations.

According to one aspect of the invention, a method of assembling an array of LED dies on a substrate is provided. The method includes the steps of positioning dies in fluid; exposing the dies to a magnetic force to attract the dies onto the front side of the substrate using magnets that are arranged at pre-determined locations either directly on the backside of the substrate or near the backside of the substrate; and forming permanent electrical and/or mechanical connections between the dies and the substrate thereby constituting an array of LED dies on a substrate.

DETAILED DESCRIPTION OF THE INVENTION

Figure 1:
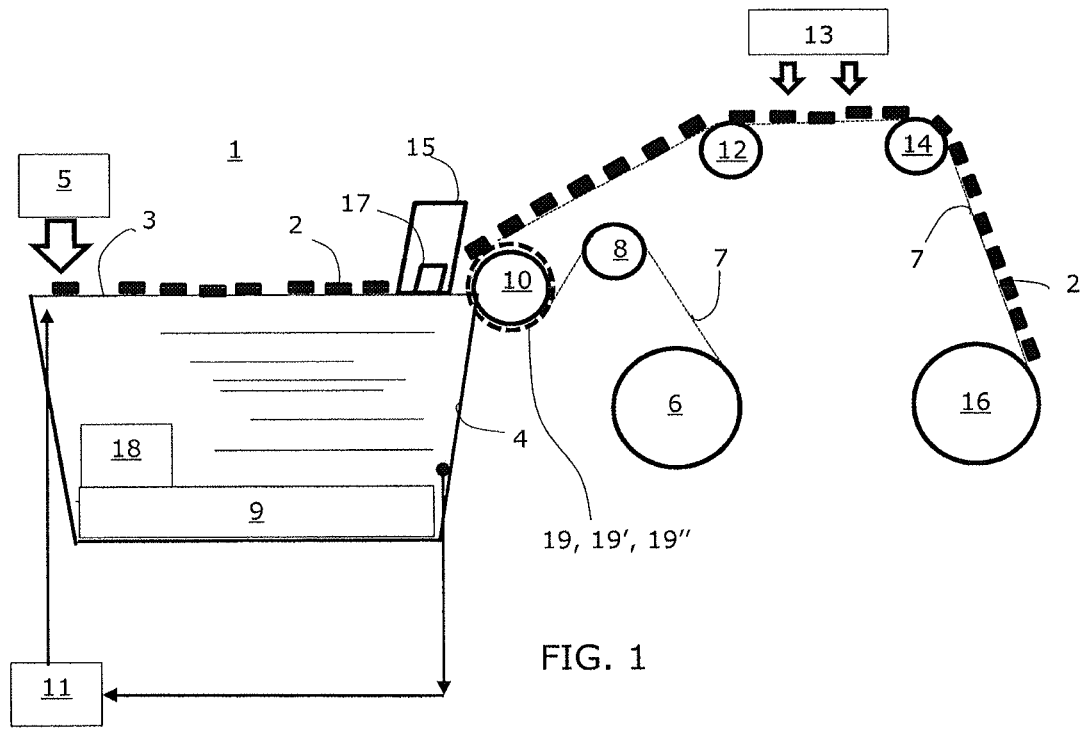
FIG. 1 depicts a schematic view of an apparatus for assembling LED's on a substrate.

FIG. 1 depicts an apparatus 1 for assembling LED dies on a substrate according to a first exemplary embodiment of the invention. A die is an individual chip that diced from a device wafer, where the device wafer may be a large piece of a semiconductor. Apparatus 1 includes a container 4 for storing fluid, such as water. Feeder 5 is positioned above container 4 for distributing buoyant LED dies 2 onto surface 3 of the fluid. Feeder 5 may be a funnel, vibration feeder or a rotary feeder, for example.

Substrate 7, which is flexible and wound around and stored in substrate reel 6, is wound about cog 8, magnetic roller 10, cog 12, cog 14 and reel 16. Substrate 7 is optionally composed of polyethylene terephthalate having a thickness of 0.127 mm/5 mil. Other transparent materials for use as substrate 7 with good transparency in the visible or UV would include flexible glass or polymers, including but not limited to polyethylene terephthalate, polycarbonate or other like materials. Substrate 7 may also contain color converting materials used to covert LED light to other wavelengths. Alternatively, a highly reflective material comprised of a dielectric reflector and/or metal reflector may be used. Various uses as required by the optical design and performance of the system can be considered.

Although not shown, one or more of reel 6, cog 8, magnetic roller 10, cog 12, cog 14 and reel 16 may be connected to a stepper motor (not shown), which causes rotation of the driven roller/cog/reel about its axis of rotation (the axis of rotation extends into the page). It should be understood that, in operation, substrate 7 moves from reel 6 to reel 16.

Screen 15, which resides at the edge of container 4 adjacent magnetic roller 10, has a series of apertures 17 (one shown). Apertures 17 are sized to position dies 2 in the proper orientation before dies 2 are loaded onto substrate 7.

Magnetic roller 10 is positioned at the edge of container 4 adjacent screen 15. Magnetic roller 10 includes an array of magnets 19 that are arranged on its periphery. Magnets 19 facilitate the magnetic pickup of dies 2 on substrate 7. According to one exemplary embodiment, thirty cube-shaped magnets 19 are arranged on roller 10. Each magnet 19 may be a nickel-plated Neodymium N42 magnet that is distributed commercially by K&J Magnetics of Jamison, Pa., USA. Electromagnets may also be used.

According to one exemplary embodiment, each magnet 19 has a side length of 1.588 mm (1/16 inch) that is embedded into a neoprene sheet 19' of the same thickness, which is wrapped around roller 10. The size and pitch of magnets 19 may vary, and are dictated by the LED die size and density of LED array needed, depending on application requirements. Openings in neoprene sheet 19' can be formed using a CO2 laser with an edge-to-edge distance of 10 mm (pitch≈10.79 mm) in the horizontal direction (i.e., perpendicular to direction of web movement) and an edge-to-edge distance of 13 mm (pitch≈13.79 mm) in the direction of web movement. A thin layer of transparent adhesive tape 19" is applied on top of magnets 19 to provide a smooth outer surface on the roller 10.

According to one exemplary method of operating apparatus 1, feeder 5 distributes buoyant LED dies 2 onto surface 3 of the fluid. Magnet 9 is activated causing LED dies 2 to temporarily sink toward the bottom of container 4. Once at or near the bottom of container 4, magnet 9 is deactivated and dies 2, which are buoyant, assume the proper top/bottom orientation as they rise and resurface onto top surface 3 of the fluid. Vibrator 18 may be employed to vibrate the fluid within container 4 to further facilitate proper top/bottom orientation of dies 2 as dies 2 resurface.

A slight fluid current in the fluid causes dies 2 to float toward magnetic roller 10 once they resurface. The current is created by pump 11, which draws fluid from the bottom end of container 4 beneath magnetic roller 10, and delivers the fluid to the top end of container 4 at a location opposite magnetic roller 10. Pump 11 is an optional component of apparatus 1, as the water current provided by pump 11 may be disadvantageous.

Substrate 7 travels along magnetic roller 10 and passes by the edge of container 4. Substrate 7 may be at least partially positioned within container 4 in contact with fluid surface 3. The magnetic regions on roller 10 attract dies 2. The magnetic force causes dies 2 to pass through apertures 17 of screen 15 and attach onto substrate 7. Aperture 17 ensure that dies 2 are oriented properly on substrate 7. At this point in the process, dies 2 are releasably and magnetically attached to substrate 7.

Substrate 7 with dies 2 releasably attached thereto are directed over cog 12 and are exposed to thermal energy in the form of heat, which can be generated by, for example, infrared (IR) lamp 13. The heat generated by lamp 13 causes solder on the bottom surface of dies 2 to melt and adhere to substrate 7, thereby forming an electrical and mechanical connection between dies 2 and substrate 7. The solder may be provided in the form of bumps on the bottom surface of dies 2. Once the solder cools, dies 2 are permanently attached to substrate 7. Item 13 may alternatively represent a reflow oven.

Substrate 7 with dies 2 permanently attached thereto are directed over cog 14 and are wound about reel 16. Substrate 7 with dies 2 permanently attached thereto form a sheet of LED's. Once reel 6 is emptied and reel 16 is filled, reel 6 is replaced with a full reel, and reel 16 is removed from apparatus 1 and is ready for use as a sheet of LED's.

Apparatus 1 may vary from that which is shown and described. For example, magnets may be positioned on the front side or backside of substrate 7 instead of roller 10. Also, several components of apparatus 1 are optional, such as vibrator 18, pump 11 and magnet 9.

Although not shown, substrate 7 may contain optical and electrical structures (e.g., phosphors, lens structures, and electrical interconnects) that are formed prior to assembling dies 2 onto substrate 7. Dies 2 could be placed on substrate 7 so that they register with those preexisting features of substrate 7. Substrate 7 could also be used to create laminated die structures that could be subsequently processed (e.g., laser drilling, inkjet electrical trace printing, phosphor deposition, etc.). Regardless of the process, thin "sheets of light" could form the high volume, low cost foundation of a wide range of novel illumination systems that would mimic organic light-emitting diode (OLED) technology, but with distinguished advantages over OLED. Further details regarding OLED technology may be found at http://en.wikipedia.org/wiki/OLED, for example.

Figure 2:
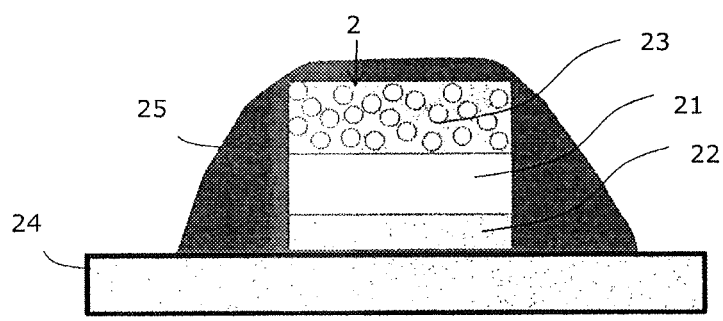
FIG. 2 depicts a cross-sectional view of a LED die mounted to a tape backing.

FIG. 2 depicts a cross-sectional view of die 2 of FIG. 1. Die 2 is shown releasably mounted to tape release layer 24 and encapsulated in encapsulant 25. Referring now to the features of die 2, each die 2 may be fabricated from a Silicon wafer 21 having a thickness of 200 μm, for example. A Silicon die may be used for developing the process. For Gallium nitride (GaN) based LED packaging, wafer 21 may be made of GaN or may include GaN on its substrate, such as sapphire or 4H Silicon Carbide (SiC), or silicon. The thickness of die 2 may also vary, depending on whether or not a substrate is employed.

One side of wafer 21 includes a magnetic layer 22. Magnetic layer 22 may be composed of a 1.65 μm thick nickel film deposited using electron beam evaporation from 99.999% pure Ni pellets. Magnetic layer 22 can be deposited using various techniques, such as electroplating or e-beam evaporation. Screen printing can also be used for creating embedded powder magnets. Nickel is compatible with common LED fabrication processes and is a promising material for use as a magnetic layer.

The opposite side of wafer 21 is coated with a thick, lightweight and buoyant layer 23 that is designed to provide buoyancy to die 2 and help orient it in correct top/bottom orientation on fluid surface 3. Buoyant layer 23 should have a low density, be mechanically robust to survive dicing and handling of die 2, and have low water absorption when submerged in water. By way of example, buoyant layer 23 may be composed of syntactic foam. Porous materials may be undesirable if they are susceptible to water absorption.

According to one exemplary method for creating buoyant layer 23, hollow glass microspheres are first mixed with organic matrix material. With regard to the hollow glass microspheres, one example of a suitable material is 3M™ Glass Bubbles K1, which is made commercially available by 3M™ Energy and Advanced Materials. The 3M™ Glass Bubbles K1 are particularly suitable due to their low density (0.125 g/cc) and high isostatic crush strength (250 psi). Properties of this material are listed in Table 1.

TABLE 1

Properties of glass microspheres from 3M ™ Glass Bubbles.

| Name | | K1 Glass Bubbles |
|---|---|---|
| Composition | | Soda-lime-borosilicate glass |
| Target crush strength (90% survival, psi) | | 250 |
| True Density (g/cc) | | 0.125 |
| Distribution of particle size (microns, by volume) | 10th % | 30 |
| | 50th % | 65 |
| | 90th % | 115 |
| Color (unaided eye) | | White |

With regard to the organic matrix material, one example of a suitable material is Benzocyclobutene (BCB), which is made commercially available by the Dow Chemical Company™ under the trade name CYCLOTENE™ 3022-57. S1813 photoresist may also be used.

Figure 3:
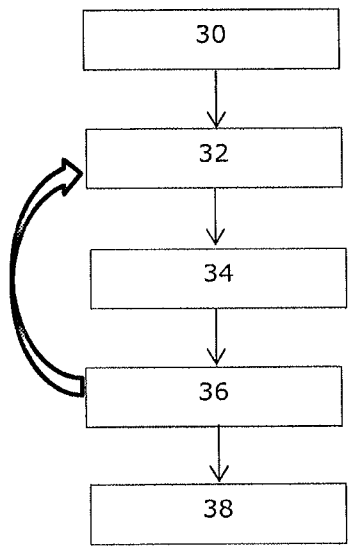
FIG. 3 depicts an exemplary process sequence for fabricating a buoyant layer of a die.

FIG. 3 depicts an exemplary process sequence for fabricating buoyant layer 23 of die 2. According to one exemplary method of fabricating buoyant layer 23, at step 30, an adhesion promoter is applied to wafer 21 of die 2. At step 32, an organic matrix is spun coat onto the wafer at 1000 rpm for 30 seconds. At step 34, glass microsphere's are spun coat onto the wafer at 1000 rpm for 30 seconds. The glass microspheres and the organic matrix are deposited using spin-coating in separate steps because pre-mixing them may not provide a homogenous mixture due to the buoyancy of the microspheres. At step 36, the wafer is baked at 155 Celsius for 2 minutes. Thereafter, steps 32, 34 and 36 are repeated in sequence four times. At step 38, the wafer is baked at 155 Celsius for 2 minutes. The following parameters can be optimized to create a low-density buoyant layer that is mechanically robust: matrix material, spin-coating parameters, number of spin-coating steps, and bake temperature and duration. One or more steps of this process can be repeated to achieve the desired thickness of buoyant layer 23.

After the buoyant layer deposition phase, the samples are mounted on dicing tape 24 with magnetic layer 22 of die 2 arranged face down. Tape 24 is diced into square dies, each having a side length of 1.6 mm, which is a size close to typical size of power LEDs used in lighting applications.

Considering the large amount of LED dies per wafer, it is desirable to avoid or minimize individual handling of dies 2 by releasing dies 2 from the dicing tape 24 using acetone, for example, or another solvent. To prevent the solvent from degrading buoyant layer 23, dies 2 are covered in an encapsulant 25. Individual dies 2 can either be coated by a thin layer of encapsulant 25 without being connected to each other, or they can form a "pseudowafer" containing all dies 2 on a tape connected by a large amount of encapsulant 25.

After the application of encapsulant 25, dicing tape 24 with dies 2 is submerged in a solvent bath (or sprayed with solvent). The solvent bath is separate from the water bath in container 4. After being exposed to solvent for several minutes, dies 2 are removed from the solvent bath. Thereafter, dies 2, which are still embedded in encapsulant 25, are removed from dicing tape 24 (by peeling or washing, for example) and transferred to a deionized water bath to dissolve encapsulant 25. The deionized water bath is separate from the water bath in container 4. The temperature of the deionized water bath may be elevated to 80-90 degrees Celsius, for example, and/or include ultrasound to accelerate the dissolution of encapsulant 25. When the buoyant force acting on dies 2 overcomes the adhesion to encapsulant 25, dies 2 detach from encapsulant 25 and rise to the surface of the deionized water bath leaving the remaining encapsulant 25 on the bottom of the deionized water bath. Encapsulant 25 may be dissolved completely.

After the aforementioned process is completed, dies 2 can be transferred into feeder 5 of FIG. 1. Dies 2 may be cleaned with Isopropyl alcohol, or any other solvent that does not affect buoyant layer 23, and dried before they are transferred to feeder 5.

It should be understood that encapsulant 25, the solvent bath, and the deionized water bath are optional features of the invention.

Figure 4:
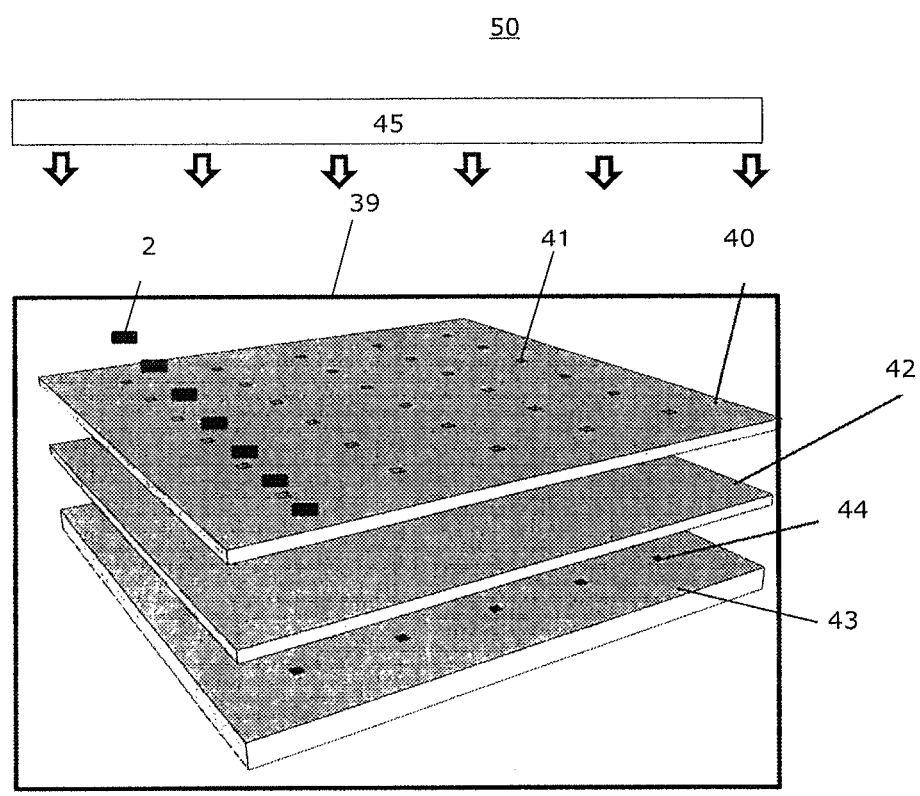
FIG. 4 depicts a schematic view of another apparatus for assembling LED's on a substrate that is shown schematically.

FIG. 4 depicts an apparatus 50 for assembling LED's on a substrate according to a second exemplary embodiment of the invention. The embodiments of FIGS. 1 and 4 are similar, and the primary differences between those embodiments will be described hereinafter. Apparatus 50 includes a container 39 for storing fluid, such as water.

Plate 43 having an array of magnets 44 is positioned in container 39 and immersed in the fluid. Mask 40 having apertures 41 is positioned above plate 43, such that magnets 44 register with apertures 41. Substrate 42, which is analogous to substrate 7 of FIG. 1, is sandwiched between plate 43 and mask 40. It should be understood that plate 43, mask 40 and substrate 42 are shown partially exploded in FIG. 4, and only a portion of dies 2 are shown.

In operation, magnets 44 are activated to cause dies 2 to sink toward the bottom of container 39. Due to the force of magnets 44, dies 2 land and orient themselves within respective apertures 41. Plate 43, mask 40 and substrate 42 are then removed from container 39. Thereafter, plate 43 and mask 40 are separated from substrate 42. Dies 2 remain in their respective positions on substrate 42.

Thereafter, substrate 42 and dies 2 are exposed to thermal energy in the form of heat generated by an infrared (IR) lamp 45. The heat generated by lamp 45 causes solder on the bottom surface of dies 2 to melt and adhere to substrate 42, thereby forming an electrical and mechanical connection between dies 2 and substrate 42 to form a sheet of LED's.

Figure 5:
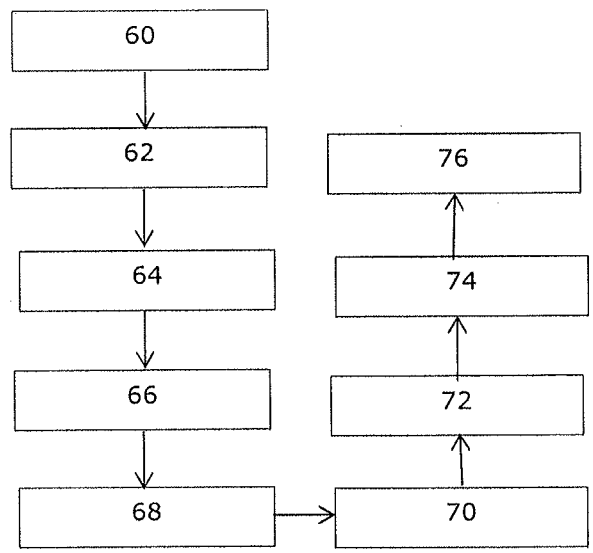
FIG. 5 is a flow chart that depicts the process steps for assembling LED's on a substrate.

FIG. 5 is a flow chart that depicts an exemplary method for assembling LED's on a substrate. It should be understood that the method depicted in FIG. 5 is not limited to any particular step, or sequence of steps. Also, the method depicted in FIG. 5 applies to apparatuses 1 and 50 of FIGS. 1 and 4, respectively.

According to the exemplary method, at step 60, magnetic layer 22 is formed on the respective dies 2. Magnetic layer 22, which may be comprised of nickel electrodes, can be formed using electron beam evaporation.

At step 62, buoyant layer 23 is formed on the respective dies 2. Buoyant layer 23 may be composed of syntactic foam. Deposition of buoyant layer 23 can be accomplished using either spin-coating in several steps using the process sequence shown in FIG. 3, or using alternative methods such as molding or stencil printing. While glass is the most common material for the hollow microspheres of buoyant layer 23, use of other materials (e.g. phenolic hollow microspheres) is also possible.

At step 64, dies 2 are taped, diced and binned, as previously described with respect to FIG. 3.

At step 66, dies 2 are released from the dicing tape using solvent. If dies 2 include encapsulant 25, then dies 2 are immersed in a deionized water bath to dissolve encapsulant 25.

At step 68, dies 2 are transferred into fluid within container 2 using feeder 5, for example.

At step 70, dies are assembled onto substrate 7 using a magnetic force, using the apparatuses 1 or 50 of FIGS. 1 and 4, respectively. This step of the process is referred to herein as directed self-assembly.

At step 72, permanent electrical connections are formed between dies 2 and substrate 7. Solder bonds can be used if electrical traces on substrate 7 were formed prior to the assembly of dies 2. Inkjet printing of conductive traces (e.g. silver nanoparticle ink) and laser drilling can be used if the traces are formed after the assembly of dies 2 on the receiving substrate 7. Alternatively, a die assembled according to step 70 may be laminated with a second optical material before electrical contact formation, with subsequent electrical contact formation made through laser drilling a via for printed or plated electrical connections to the buried die.

At step 74, buoyant layer 23 is dissolved. This step can be accomplished using organic solvents which are capable of dissolving either the matrix of buoyant layer 23 or the (optional) adhesive layer that keeps buoyant layer 23 attached to the die surface.

At step 76, phosphors are deposited on dies 2, and then dies 2 are encapsulated. This step can be accomplished either after buoyant layer 23 is dissolved, or before the buoyant layer 23 is deposited on die 2 at step 62. Thereafter, dies 2 on substrate 7 constitute a sheet of LED's that are ready for use.

Test Results: Introducing Dies into the Fluid

Introducing dies to the fluid with correct top/bottom orientation is a prerequisite for the pickup of dies on a flexible substrate. Several methods were tested to determine the best way to achieve the correct top/bottom orientation of the dies. The goal of the test was to achieve a high percentage (referred to as yield) of dies floating with correct top/down orientation, i.e., buoyant layer oriented on top, the magnetic layer oriented on the bottom and the angle between the die and waters surface less than 90 degrees. Yields for the following methods were compared during the test:

A. Dropping dies 2 from 30 cm onto the fluid surface 3 through a funnel to allow dies to orient themselves during the fall;
B. Sinking dies 2 with a magnet 9 located at the bottom of a shallow container and removing or deactivating magnet 9; and C. Sinking or wetting dies 2 in one container with fluid and transferring the dies with a non-magnetic mesh (i.e., aluminum mesh with a wire diameter of 0.4572 mm and openings of 1.12 mm) to another container.

The surface tension of the fluid within container 4 can play an important role in the process because surface tension of the fluid affects the way dies 2 are wetted in the fluid and can make the dies float, which is undesirable. Three options were explored during the test:

A. Introduction of dies 2 into deionized (DI) water;
B. Introduction of dies 2 into isopropyl alcohol (IPA) followed by transfer of the IPA-wetted dies into DI water; and
C. Introduction of dies 2 into water containing a surfactant of Sodium Dodecyl Sulfate (SDS) with a molar concentration of 0.01 M, which is slightly above critical micelle concentration of 0.008 M.

Yields were compared for the methods of introducing dies into the fluid, as shown in Table 2. In each case 500 data points (dies) were used. Tests were conducted in 22×18 cm container with 1 liter of fluid. The die surface was cleaned with IPA and dried before each test.

TABLE 2

Yields for different methods introducing dies into the carrier fluid (500 dies were used in each test).

| Method for introducing dies into | Yield |
|---|---|
| Dropping from 30 cm into DI water | 95.4% |
| Dropping from 30 cm water with 0.01M of SDS | 97.8% |
| Sinking with a magnet in a shallow container with DI water and releasing the magnet | 99.2% |
| Dropping from 30 cm into IPA and transferring with a mesh to another container with DI water | 96.2% |
| Sinking with a magnet in a shallow container with water containing 0.01M of SDS and releasing the magnet | 99.8% |
| Sinking with a magnet in a shallow container with water containing 0.01M of SDS and transferring with a mesh to another container with 0.01M of SDS in water | 100% |

Three important observations resulting from the test are summarized hereinafter. First, within several seconds after the IPA wetted dies were transferred into the water, the dies 2 moved in fast abrupt thrusts, often accompanied by rotation of the dies. This behavior can also be observed if the dies are wetted with methanol or acetone. This behavior may be attributed to the local decrease of surface tension due to the presence of IPA.

Second, few dies 2 were trapped below other dies. Agitation or vibration allowed any trapped dies to escape and reach the water surface. There was no noticeable impact of this die behavior on the assembly process.

Third, sinking dies 2 using a magnet 9 offers the best results, and transferring the dies using a mesh allows using this method even when limitations of the setup do not allow placing a magnet directly below the container, where the next step (i.e., pickup on a flexible substrate) is performed.

Test Results: Magnetic Force-Assisted Die Assembly

Once dies 2 are transferred to the fluid in container 4, they are assembled on flexible substrate 7, as described previously. Effects of the key process parameters are evaluated and summarized as follows:

A. Angle between substrate and the container: an angle of close to 90 degrees between the substrate and the container can be beneficial in reducing the accidental pickup of dies on the substrate.

B. Substrate movement speed: a lower speed in the range of 1-10 mm/s results in pickup of multiple dies with one magnet. Increasing substrate speed to the range of 50-100 mm/s can resolve this issue, but high substrate speed makes the reliable die supply to the interface a more difficult task.

C. Vibration of water surface: a low-frequency vibration (7-10 Hz) of the water surface provides a rejection mechanism during the die pickup and reduces the amount dies that are picked up in the wrong positions. High frequency vibrations (e.g., 1 G vibration at 12000 rpm by a vibrating disk motor) do not have any measurable impact on the process.

D. Magnet material: the strength of a Neodymium (Nd) magnet is adequate for the pickup process. If a lower surface tension is used instead of vibrations as a die rejection mechanism, then the attraction by these magnets is too strong and can be reduced by partial demagnetization at elevated temperatures above 140 degrees Celsius.

E. Water flow: assembly at zero water flow results in more reproducible results. The zero water flow reduces uncertainty caused by turbulent flow of the fluid in the container, and helps to control surface tension more reliably. The fluid in the container between test runs can be refilled with a syringe. Even at zero water flow, the substrate draws certain amount of fluid as it moves, providing additional attraction force for the dies to the substrate.

F. The die pickup process can be improved by placing a screen (such as screen 15) with vertical slits or apertures 17 in front of the substrate to reduce the possibility of picking up more than one die by each magnet. An aperture width of 2.4 to 3 mm allows dies to pass without obstruction, while preventing pickup of dies to the left and right of the magnets of the roller head.

G. The surface tension of the fluid in the container manifests itself through the following effects: it increases the chance of die pickup on the surface, reduces the chance of air bubble formation on the fluid surface, and helps to attract the dies to the interface and create reliable supply of dies for magnetic pickup on a substrate. A lower surface tension is preferable as the benefits of lowering the force, which competes with magnetic pick up, outweigh the advantages provided by the surface tension. Measured surface tension of 42 dyn/cm (for water with 0.01M of SDS) is low enough to prevent accidental pickup and is used an alternative to vibration as a die rejection mechanism.

Table 3 summarizes the assembly parameters that were optimized for assembly yield. The achievable yield is 86%, which is defined as the ratio between the amount of dies picked up at the correct locations to the total amount of dies picked up.

TABLE 3

Parameters for magnetic die pickup process.

| Parameter | Value |
|---|---|
| Angle between the substrate and cartridge | 90° |
| Substrate material | Kapton 500 HPPST |
| Magnet material | NdFeB N42, partially demagnetized at 180 degrees Celsius |
| Substrate speed | 50 mm/s |

TABLE 3-continued

Parameters for magnetic die pickup process.

| Parameter | Value |
|---|---|
| Surface tension of carrier fluid | 42 dyn/cm |
| Vibration frequency | 10 Hz |
| Slit width | 2.8 mm |

Test Results: Summary and Conclusions

The testing shows that the directed self-assembly technique enables high-speed assembly of small semiconductor dies on a large area flexible substrate in a roll-to-roll process.

Fluidic handling of dies can be used as an alternative to serial mechanical handling. The fluidic handling methods described herein are based on floatation of dies on the fluid surface. Die floatation is achieved by creating a layer consisting of hollow glass microsphere in several spin-coating steps. Assembly of dies having correct top/down orientation on the fluid surface can be accomplished with high yield. Magnetic die pickup is a fast way for assembling dies on large area substrates. The wide parameter space allows numerous options for process optimization to improve the die placement yield, particularly for assembly of specially designed LED's.

Directed Self Assembly (DSA) using magnetic force and a fluid medium is a perspective replacement for pick-and-place LED assembly. The use of magnetism, instead of electrostatics, reduces the risk of electrostatic discharge (ESD) damage to the components during assembly. Magnetism is also less sensitive to the surface properties of the component and the substrate.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. A method of assembling an array of light emitting diode (LED) dies on a substrate comprising:
   positioning dies in fluid;
   exposing the dies to a magnetic force to attract the dies onto a front side of a substrate using magnets that are arranged at pre-determined locations either directly on the backside of the substrate or near the backside of the substrate; and
   forming permanent electrical and/or mechanical connections between the dies and the substrate thereby constituting an array of LED dies on a substrate,
   wherein prior to the positioning, the method comprises forming a buoyant layer on one side of each of the dies.

2. The method of claim 1, wherein prior to the positioning, the method comprises forming a magnetic layer on another side of each of the dies.

3. The method of claim 1, wherein after the positioning, the method further comprises temporarily sinking the dies using another magnetic force and then deactivating the magnetic force so that the dies rise to a top surface of the fluid with the buoyant layer facing in an upward direction.

4. The method of claim 1, wherein the method further comprises dissolving the buoyant layer.

5. The method of claim 1 further comprising advancing the substrate with respect to the fluid to continuously expose the dies to magnetic forces and continuously attract the dies onto respective ones of the magnets that are arranged at pre-determined locations either directly on the backside of the substrate or near the backside of the substrate.

6. The method of claim 1, wherein the forming comprises exposing the dies and the substrate to an elevated temperature to cause solder on a surface of the dies to adhere to the substrate.

* * * * *

UNITED STATES PATENT AND TRADEMARK OFFICE
CERTIFICATE OF CORRECTION

PATENT NO.         : 9,245,875 B2
APPLICATION NO.    : 14/394501
DATED              : January 26, 2016
INVENTOR(S)        : Robert F. Karlicek, Jr. et al.

It is certified that error appears in the above-identified patent and that said Letters Patent is hereby corrected as shown below:

Title page, item (72) Inventors: Robert F. Karlicek should read Robert F. Karlicek -- Jr. --

On page 2, item (56) References Cited, Other Publications: Ramadan et al. Title should read "Large scale microcomponents assembly using an external magnetic array"

Signed and Sealed this
Twenty-sixth Day of April, 2016

Michelle K. Lee
*Director of the United States Patent and Trademark Office*